(12) United States Patent
Li

(10) Patent No.: US 9,041,837 B2
(45) Date of Patent: May 26, 2015

(54) IMAGE SENSOR WITH REDUCED BLOOMING

(71) Applicant: Apple Inc., Cupertino, CA (US)

(72) Inventor: Xiangli Li, San Jose, CA (US)

(73) Assignee: Apple Inc., Cupertino, CA (US)

( * ) Notice: Subject to any disclaimer, the term of this patent is extended or adjusted under 35 U.S.C. 154(b) by 167 days.

(21) Appl. No.: 13/785,070

(22) Filed: Mar. 5, 2013

(65) Prior Publication Data

US 2014/0253768 A1 Sep. 11, 2014

(51) Int. Cl.
*H04N 5/359* (2011.01)
*H04N 5/335* (2011.01)
*H01L 27/146* (2006.01)

(52) U.S. Cl.
CPC ............. *H04N 5/3592* (2013.01); *H04N 5/335* (2013.01); *H01L 27/14603* (2013.01); *H01L 27/14641* (2013.01); *H01L 27/14672* (2013.01)

(58) Field of Classification Search
CPC .................. H01L 27/14672; H01L 27/14674; H01L 27/14654; H01L 27/14656; H01L 27/14887; H04N 3/1556; H04N 3/1587; H04N 5/2175; H04N 5/359; H04N 5/3591; H04N 5/3592; H04N 5/3594; H04N 5/3595; H04N 5/3597; H04N 5/357; H04N 3/1568
USPC .................................................. 348/241, 248
See application file for complete search history.

(56) References Cited

U.S. PATENT DOCUMENTS

| 4,686,648 A | 8/1987 | Fossum |
| 5,105,264 A | 4/1992 | Erhardt et al. |
| 6,040,568 A | 3/2000 | Caulfield et al. |
| 6,233,013 B1 | 5/2001 | Hosier et al. |
| 6,714,239 B2 | 3/2004 | Guidash |
| 7,091,466 B2 | 8/2006 | Bock |

(Continued)

FOREIGN PATENT DOCUMENTS

| EP | 2023611 | 2/2009 |
| EP | 2107610 | 10/2009 |

(Continued)

OTHER PUBLICATIONS

Feng, et al., "On the Stoney Formula for a Thin Film/Substrate System with Nonuniform Substrate Thickness," Journal of Applied Mechanics, Transactions of the ASME, vol. 74, Nov. 2007, pp. 1276-1281.

(Continued)

*Primary Examiner* — Nelson D. Hernández Hernández
(74) *Attorney, Agent, or Firm* — Brownstein Hyatt Farber Schreck, LLP

(57) ABSTRACT

An image sensor for an electronic device. The image sensor includes a first light sensitive element for collecting charge and having a first saturation value and a well surrounding at least a portion of the first light sensitive element and having a first doping concentration. The image sensor further includes a bridge region defined in the well and in communication with the first light sensitive element and having a second doping concentration and a blooming node in communication with the bridge region and a voltage source. The second doping concentration is less than the first doping concentration and when light sensitive element collects sufficient charge to reach the first saturation value, additional charge received by the light sensitive element travels to the blooming node via the bridge region.

21 Claims, 9 Drawing Sheets

(56) References Cited

U.S. PATENT DOCUMENTS

| | | |
|---|---|---|
| 7,259,413 B2 | 8/2007 | Rhodes |
| 7,262,401 B2 | 8/2007 | Hopper et al. |
| 7,390,687 B2 | 6/2008 | Boettiger |
| 7,443,421 B2 | 10/2008 | Stavely et al. |
| 7,626,626 B2 | 12/2009 | Panicacci |
| 7,671,435 B2 | 3/2010 | Ahn |
| 7,728,351 B2 | 6/2010 | Shim |
| 7,742,090 B2 | 6/2010 | Street |
| 7,755,158 B2 | 7/2010 | Lee |
| 7,773,138 B2 | 8/2010 | Lahav et al. |
| 7,796,171 B2 | 9/2010 | Gardner |
| 7,880,785 B2 | 2/2011 | Gallagher |
| 7,884,402 B2 | 2/2011 | Ki |
| 7,906,826 B2 | 3/2011 | Martin et al. |
| 7,952,635 B2 | 5/2011 | Lauxtermann |
| 8,026,966 B2 | 9/2011 | Altice |
| 8,153,947 B2 | 4/2012 | Barbier et al. |
| 8,159,588 B2 | 4/2012 | Boemler |
| 8,184,188 B2 | 5/2012 | Yaghmai |
| 8,233,071 B2 | 7/2012 | Takeda |
| 8,310,577 B1 | 11/2012 | Neter |
| 8,340,407 B2 | 12/2012 | Kalman |
| 8,350,940 B2 | 1/2013 | Smith et al. |
| 8,508,637 B2 | 8/2013 | Han et al. |
| 8,514,308 B2 | 8/2013 | Itonaga et al. |
| 8,581,992 B2 | 11/2013 | Hamada |
| 8,629,484 B2 | 1/2014 | Ohri et al. |
| 8,723,975 B2 | 5/2014 | Solhusvik |
| 8,754,983 B2 | 6/2014 | Sutton |
| 2008/0315198 A1 | 12/2008 | Jung |
| 2009/0096901 A1* | 4/2009 | Bae et al. .................. 348/294 |
| 2009/0101914 A1* | 4/2009 | Hirotsu et al. .............. 257/72 |
| 2009/0201400 A1 | 8/2009 | Zhang et al. |
| 2011/0080500 A1 | 4/2011 | Wang et al. |
| 2011/0156197 A1 | 6/2011 | Tivarus et al. |
| 2011/0205415 A1 | 8/2011 | Makino et al. |
| 2011/0241089 A1* | 10/2011 | Ohri et al. ................ 257/291 |
| 2012/0098964 A1 | 4/2012 | Oggier et al. |
| 2012/0153125 A1 | 6/2012 | Oike et al. |
| 2014/0004644 A1 | 1/2014 | Roy |
| 2014/0049683 A1 | 2/2014 | Guenter |
| 2014/0246568 A1 | 9/2014 | Wan |
| 2014/0247378 A1 | 9/2014 | Sharma et al. |
| 2014/0252201 A1 | 9/2014 | Li et al. |
| 2014/0263951 A1 | 9/2014 | Fan et al. |
| 2014/0267855 A1 | 9/2014 | Fan |

FOREIGN PATENT DOCUMENTS

| | | |
|---|---|---|
| EP | 2230690 | 9/2010 |
| WO | WO 2012/053363 | 4/2012 |
| WO | WO 2012/088338 | 6/2012 |
| WO | WO 2012/122572 | 9/2012 |
| WO | WO 2013/008425 | 1/2013 |

OTHER PUBLICATIONS

Aoki et al., "Rolling-Shutter Distortion-Free 3D Stacked Image Sensor with −160dB Parasitic Light Sensitivity In-Pixel Storage Node," ISSCC 2013, Session 27, Image Sensors, 27.3 27.3 A, Feb. 20, 2013, retrieved on Apr. 11, 2014 from URL:http://ieeexplore.ieee.org/stamp/stamp.jsp?tp=&arnumber=6487824.
U.S. Appl. No. 13/782,532, Mar. 1, 2013, Sharma et al.
U.S. Appl. No. 13/783,536, Mar. 4, 2013, Wan.
U.S. Appl. No. 13/787,094, Mar. 6, 2013, Li et al.
U.S. Appl. No. 13/797,851, Mar. 12, 2013, Fan et al.
U.S. Appl. No. 13/830,748, Mar. 14, 2013, Fan.
U.S. Appl. No. 14/098,504, Dec. 5, 2013, Fan et al.
U.S. Appl. No. 14/207,150, Mar. 12, 2014, Kleekajai et al.
U.S. Appl. No. 14/207,176, Mar. 12, 2014, Kleekajai et al.
U.S. Appl. No. 14/276,728, May 13, 2014, McMahon et al.
U.S. Appl. No. 14/292,599, May 30, 2014, Agranov et al.
Schwarzer, et al., On the determination of film stress from substrate bending: Stoney'S formula and its limits, Jan. 2006, 17 pages.
U.S. Appl. No. 14/611,917, filed Feb. 2, 2015, Lee et al.

* cited by examiner

IMAGE SENSOR WITH REDUCED BLOOMING

TECHNICAL FIELD

The present invention relates generally to electronic devices, and more specifically, to image sensors for electronic devices.

BACKGROUND

Cameras and other image recording devices often use one or more image sensors, such as a charged-coupled device (CCD) sensor or a complementary metal-oxide-semiconductor (CMOS) image sensor. A typical CMOS image sensor may include a two-dimensional array of pixels, where each pixel may include a photo detector or light sensitive element, such as a photodiode, and one or more transistors to activate each pixel.

The photodiode or other light detector may capture light which may then be used to create an image of a scene or object. Depending on the light exposed to the image sensor, as well as the configuration of the image sensor, one or more image artifacts may appear in the image. For example, light may impinge on a certain pixel or group of pixels that may exceed the charge capacity of the exposed pixels. The excess charge may then "spill" into adjacent pixels that may not have yet reached capacity. Due to the spillage into adjacent pixels, the captured image may cause certain pixels (e.g., the overflow pixels) to produce inaccurate image data. This light leakage is generally referred to as blooming and may impact the white balance and/or color accuracy of the captured image.

The blooming or excessive light exposure may be due to a light source within a captured scene or object, as well as to a color filter that may be used with the image sensor. For example, some image sensors may utilize a Bayer or other color filter, where light is filtered before reaching each pixel. Certain light wavelengths (or colors) may be more dominate in a scene or object or may increase the sensitivity of the pixel. This may result in the image sensor capturing an image where the color accuracy may be affected. For example, pixels with certain color filters may fill up quickly, blooming to adjacent pixels.

SUMMARY

Examples of the disclosure may an image sensor for an electronic device. The image sensor includes a first light sensitive element for collecting charge and having a first saturation value and a well surrounding at least a portion of the first light sensitive element and having a first doping concentration. The image sensor further includes a bridge region defined in the well and in communication with the first light sensitive element and having a second doping concentration and a blooming node in communication with the bridge region and a voltage source. The second doping concentration is less than the first doping concentration and when light sensitive element collects sufficient charge to reach the first saturation value, additional charge received by the light sensitive element travels to the blooming node via the bridge region.

Other examples of the disclosure may take the form of a camera for an electronic device. The camera includes a processor, a display in communication with the processor, a lens, and an image sensor. The image sensor is in communication with the processor and in optical communication with the lens. The image sensor includes a first pixel including a first photodiode, a second pixel including a second photodiode, a blooming junction in communication with the first pixel and the second pixel, and a blooming voltage source in communication with the blooming junction, wherein the blooming voltage source determines a potential of the blooming junction. During operation, the lens transmits light to the image sensor, creating charge within the first photodiode and the second photodiode and the blooming junction selectively receives charge from the first photodiode and the second photodiode to substantially prevent the first photodiode and the second photodiode from exceeding a saturation value.

Yet other examples of the disclosure may take the form of a computing device. The computing device includes a processor and an image sensor in communication with the processor. The image sensor includes a photodiode having a full well value, a blooming node in communication with the photodiode, and a voltage source in communication with the blooming junction, wherein the voltage source determines a potential of the blooming node. During operation, when the photodiode collects charge exceeding the full well value, excess charge is transmitted to the blooming node.

SPECIFICATION

Overview

The disclosure may take the form of an image sensor for cameras and other electronic devices. The image sensor may include a blooming node that may remove excess charge from a photodiode or photogate. In some embodiments, the blooming node may define a blooming path for charge to travel away from an overexposed photodiode. The blooming node may have a positive potential and may be connected to the photodiode through a lightly doped region which is typically doped oppositely of the blooming node. As one example, the blooming node may be N-typed doped and the bridge or lightly doped region may be P-typed doped. The lightly doped region may create a low potential barrier between the blooming node and the photodiode. The barrier defined by the lightly doped region may have a lower potential than a well (such as a P-well) surrounding the photodiode. The blooming node may be tied to a voltage source, which may allow the blooming node to have a high potential. The blooming node may receive charge from a blooming pixel through the lightly doped region.

In some embodiments, the blooming node or junction may be connected to a control signal (or voltage source). The control signal may be a separate signal for the blooming node, or may be the same source as other components of the image sensor (e.g., source follower gate). Additionally, the image sensor may include a blooming node for each pixel or may include a blooming node for two or more pixels. In other words, each pixel may have its own blooming node or the blooming node may be shared by two or four pixels.

The blooming node and lightly doped region may reduce pixel blooming. Additionally, the blooming pathway to the blooming node may be separate from a transfer gate or other components of the pixel, which may allow the transfer gate to be pinned. By providing a blooming pathway, without requiring the transfer gate to be un-pinned, the image sensor may reduce blooming without creating extra dark current or hot pixels.

DETAILED DESCRIPTION

Figure 1A:
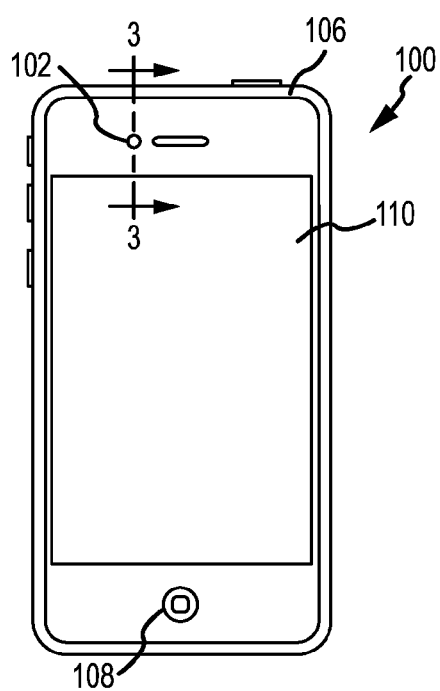
FIG. 1A is a front perspective view of an electronic device including one or more cameras.
Figure 1B:
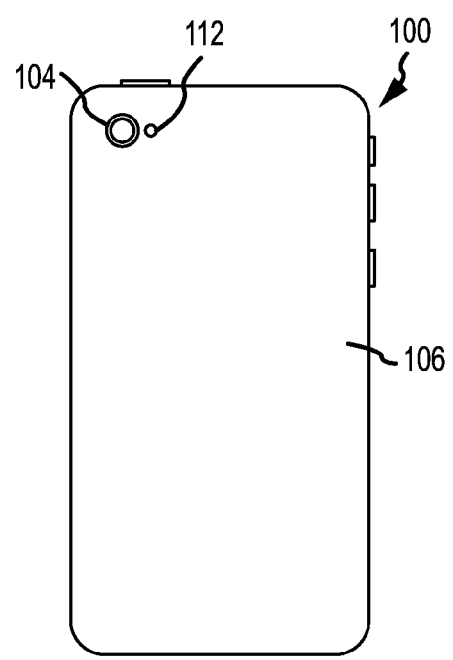
FIG. 1B is a rear perspective view of the electronic device of FIG. 1A.

Turning now to the figures, the image sensor and an illustrative electronic device for incorporating the image sensor will be discussed in more detail. FIG. 1A is a front elevation view of an electronic device 100 including the image sensor. FIG. 1B is a rear elevation view of the electronic device 100. The electronic device 100 may include a first camera 102, a second camera 104, an enclosure 106, a display 110, and an input/output button 108. The electronic device 100 may be substantially any type of electronic or computing device, such as, but not limited to, a computer, a laptop, a tablet, a smart phone, a digital camera, a printer, a scanner, a copier, or the like. The electronic device 100 may also include one or more internal components (not shown) typical of a computing or electronic device, such as, but not limited to, one or more processors, memory components, network interfaces, and so on.

As shown in FIG. 1A, the enclosure 106 may form an outer surface or partial outer surface and protective case for the internal components of the electronic device 100 and may at least partially surround the display 110. The enclosure 106 may be formed of one or more components operably connected together, such as a front piece and a back piece, or may be formed of a single piece operably connected to the display 110.

The input member 108 (which may be a switch, button, capacitive sensor, or other input mechanism) allows a user to interact with the electronic device 100. For example, the input member 108 may be a button or switch to alter the volume, return to a home screen, and the like. The electronic device 100 may include one or more input members 108 and/or output members, and each member may have a single input or output function or multiple input/output functions.

The display 110 may be operably connected to the electronic device 100 or may be communicatively coupled thereto. The display 110 may provide a visual output for the electronic device 100 and/or may function to receive user inputs to the electronic device 100. For example, the display 110 may be a multi-touch capacitive sensing screen that may detect one or more user inputs.

Figure 2:
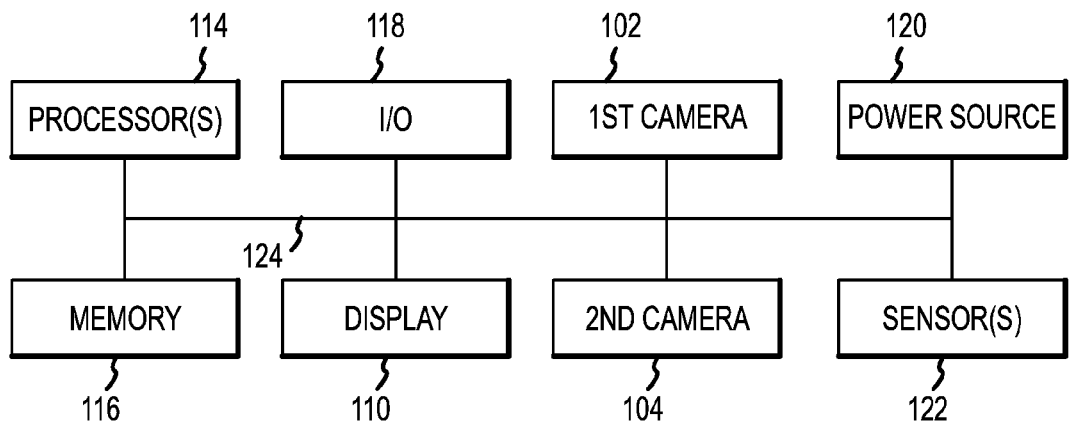
FIG. 2 is a simplified block diagram of the electronic device of FIG. 1A.

The electronic device 100 may also include a number of internal components. FIG. 2 is a simplified block diagram of the electronic device 100. The electronic device 100 may also include one or more processors 114, a storage or memory component 116, an input/output interface 118, a power source 120, and one or more sensors 122, each will be discussed in turn below.

The processor 114 may control operation of the electronic device 100. The processor 114 may be in communication, either directly or indirectly, with substantially all of the components of the electronic device 100. For example, one or more system buses 124 or other communication mechanisms may provide communication between the processor 114, the cameras 102, 104, the display 110, the input member 108, the sensors 122, and so on. The processor 114 may be any electronic device cable of processing, receiving, and/or transmitting instructions. For example, the processor 114 may be a microprocessor or a microcomputer. As described herein, the term "processor" is meant to encompass a single processor or processing unit, multiple processors, or multiple processing units, or other suitably configured computing element.

The memory 116 may store electronic data that may be utilized by the electronic device 100. For example, the memory 116 may store electrical data or content e.g., audio files, video files, document files, and so on, corresponding to various applications. The memory 116 may be, for example, non-volatile storage, a magnetic storage medium, optical storage medium, magneto-optical storage medium, read only memory, random access memory, erasable programmable memory, or flash memory.

The input/output interface 118 may receive data from a user or one or more other electronic devices. Additionally, the input/output interface 118 may facilitate transmission of data to a user or to other electronic devices. For example, in embodiments where the electronic device 100 is a phone, the input/output interface 118 may be used to receive data from a network, or may be used to send and transmit electronic signals via a wireless or wired connection (Internet, WiFi, Bluetooth, and Ethernet being a few examples). In some embodiments, the input/output interface 118 may support multiple network or communication mechanisms. For example, the network/communication interface 118 may pair with another device over a Bluetooth network to transfer signals to the other device, while simultaneously receiving data from a WiFi or other network.

The power source 120 may be substantially any device capable of providing energy to the electronic device 100. For example, the power source 120 may be a battery, a connection cable that may be configured to connect the electronic device 100 to another power source such as a wall outlet, or the like.

The sensors 122 may include substantially any type of sensor. For example, the electronic device 100 may include one or more audio sensors (e.g., microphones), light sensors (e.g., ambient light sensors), gyroscopes, accelerometers, or the like. The sensors 122 may be used to provide data to the processor 114, which may be used to enhance or vary functions of the electronic device 100.

Figure 3:
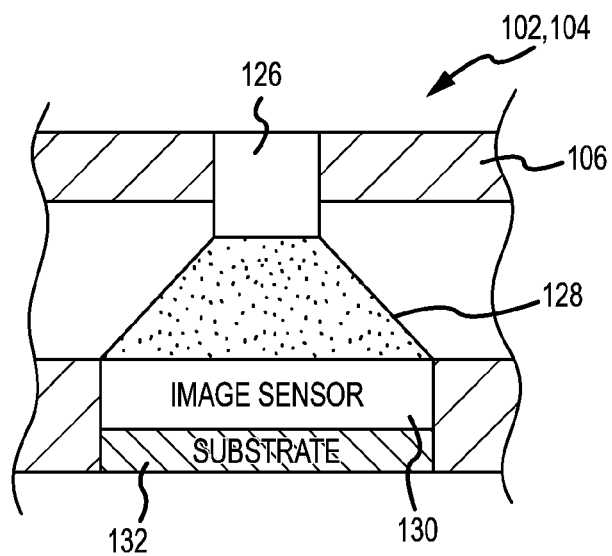
FIG. 3 is a cross-section view of the electronic device of FIG. 1A taken along line 3-3 in FIG. 1A.

With reference again to FIGS. 1A and 1B, the electronic device 100 may also include one or more cameras 102, 104 and optionally a flash 112 or light source for the cameras. FIG. 3 is a simplified cross-section view of one camera 102, taken along line 3-3 in FIG. 1A. Although FIG. 3 illustrates the first camera 102, it should be noted that the second camera 104 may be substantially similar to the first camera 102. In some embodiments one camera may include a global shutter configured image sensor and one camera may include a rolling shutter configured image sensor. In other examples, one camera may have an image sensor with a higher resolution than the image sensor in the other camera. With reference to FIG. 3, the cameras 102, 104 may include a lens 126 in optical communication with an image sensor 130. The lens 126 may be operably connected to the enclosure 106 and positioned above the image sensor 130. The lens 126 may direct or transmit light 128 within its field of view on to a photodiode layer (discussed in more detail below) of the image sensor 130.

The image sensor 130 may be supported beneath the lens 126 by a substrate 132 or other support structure. The image sensor 130 may convert light 128 into electrical signals that may represent the light from the captured scene. In other words, the image sensor 130 captures the light 128 optically transmitted via the lens 126 into electrical signals.

Image Sensor Architecture

Figure 4:
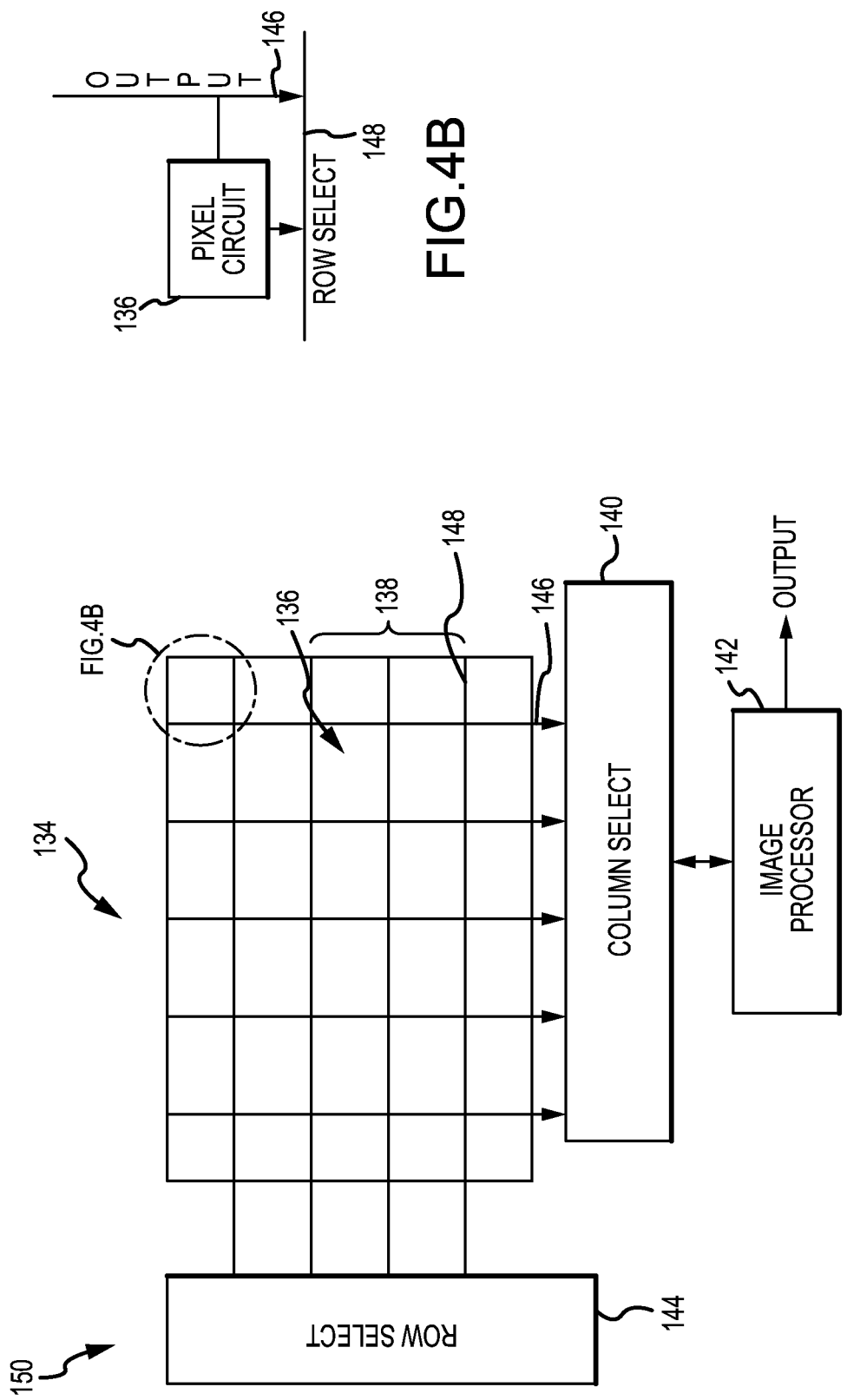
FIG. 4A is a simplified diagram of an image sensor architecture for a camera of the electronic device.
FIG. 4B is an enlarged view of the pixel architecture of FIG. 4A illustrating a single pixel.
Figure 5:
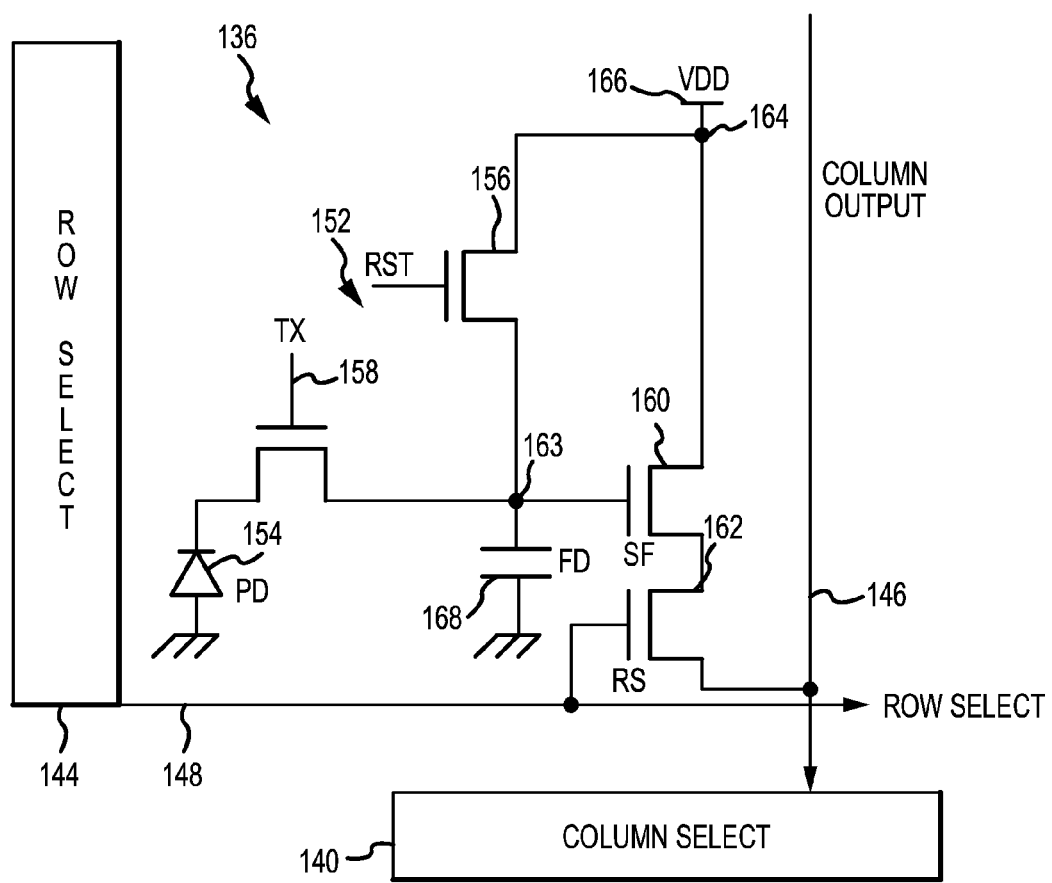
FIG. 5 is a simplified schematic view of the pixel of FIG. 4A.

An illustrative architecture for the image sensor 130 will now be discussed in more detail. FIG. 4A is a simplified schematic of an architecture for the image sensor 130. FIG. 4B is an enlarged view of a pixel of the pixel architecture of FIG. 4A. FIG. 5 is a simplified schematic view of the pixel of FIG. 4A. As will be discussed in more detail below, with reference to FIG. 7A, the architecture of FIG. 4A-5 may be implemented with the blooming node, although the blooming node is not shown in FIG. 5.

With reference to FIGS. 4A-5, the image sensor may include an image processing component 150 and a pixel architecture 134 or pixel array. This architecture defines one or more pixels 136 and/or groups of pixel cells 138 (e.g., groups of pixels 136 grouped together to form a Bayer pixel or other set of pixels). The pixel architecture 134 may be in communication with a column select 140 through one or more column output lines 146 and a row select 144 through one or more row select lines 148.

The row select 144 and/or the column select 140 may be in communication with an image processor 142. The image processor 142 may process data from the pixels 136 and provide that data to the processor 114 and/or other components of the electronic device 100. It should be noted that in some embodiments, the image processor 142 may be incorporated into the processor 114 or separate therefrom. The row select 144 may selectively activate a particular pixel 136 or group of pixels, such as all of the pixels 136 on a certain row. The column select 140 may selectively receive the data output from select pixels 136 or groups of pixels 136 (e.g., all of the pixels with a particular column).

With reference to FIG. 5, each pixel 136 may include a transistor array 152 or control circuitry and a photodiode 154. The photodiode 154 may be in optical communication with the lens 126 to receive light transmitted therethrough. The photodiode 154 may absorb light and convert the absorbed light into an electrical signal. The photodiode 154 may be an electron-based photodiode or a hole based photodiode. Additionally, it should be noted that the term photodiode as used herein is meant to encompass substantially any type of photon or light detecting component, such as a photogate or other photon sensitive region. The photodiode 154 is coupled to a transfer gate 158, the transfer gate 158 selectively connects the photodiode 154 to the remaining control circuitry 152 of the pixel 136.

The transfer gate 158 is coupled to a reset gate 156 and a source follower gate 160. A reset gate 162 and the source follower gate 160 are coupled to a reference voltage node 164 which connects the two gates to a reference voltage source (Vdd) 166. The row select gate 162 is coupled to a row select line 148 for the pixel 136. A floating diffusion node 163 including a charge storage component 168 may be coupled between the transfer gate 158 and the reset gate 156 and source follower gate 160. The control circuitry 152 (or transistor array) may include additional gates other than those shown in FIG. 5. For example, an anti-blooming gate may be in communication with the photodiode 154 to drain charge in excess of saturation level from the photodiode.

Generally, in operation, when one of the cameras 102, 104 is actuated to take a picture by a user, the reference voltage 166 is applied to the reset gate 156 and the transfer gate 158. When the transfer gate 158 is open, the charge within the photodiode 154 is drained to deplete the photodiode. In some embodiments, the cameras 102, 104 may not include a shutter over the lens 126, and so the image sensor 130 may be constantly exposed to light. In these embodiments, the photodiode 154 may have to be reset or depleted before a desired image is to be captured. Once the charge from the photodiode 154 has been depleted, the transfer gate 158, and the reset gate 156 may be turned off, isolating the photodiode 154. The photodiode 154 may then begin integration and collecting light 128 transmitted to the image sensor 130 from the lens 126. As the photodiode 154 receives light, it starts to collect charge (e.g., a depletion region reduces as electrons from the light are received). However, the charge within the photodiode 154 may remain within a well of the photodiode 154 because the transfer gate 158 (connecting the photodiode 154) to the control circuitry 150 and other gates is off. As will be discussed in more detail with respect to FIGS. 7A and 7B, in instances where the photodiode may be over-exposed, the excess charge may bloom to a blooming junction or node.

Once integration is complete and the photodiode 154 has collected light 128 from the lens 126, the reset gate 152 may be turned on to reset the floating diffusion node 163. Once the floating diffusion 163 has been reset, the reset gate 156 may be turned off and the transfer gate 158 may be turned on. The charge from the photodiode 154 can then be transferred to the floating diffusion node 163 and be stored in the storage component 168. To read out the charge from the photodiode 154 (here, via the floating diffusion 163), the row select gate 152 and the source follower gate 160 may be activated, and the source follower gate 160 amplifies the charge within the floating diffusion 163 and through the row select gate 162, the signal or charge is provide to the column output line 146.

In a rolling shutter operation, photodiodes 154 in different rows may be exposed at different times. Accordingly, if one or more objects within a scene are moving, a first row may capture a different position of the image than a second row as they are exposed sequentially, which may cause motion artifacts in the sensed image. In a global shutter operation, additional storage nodes may be added to store charge from the photodiode 154. In the global shutter operation, each row within the pixel architecture 134 may be reset and exposed at substantially the same time. Each pixel may also simultaneously transfer the charge from the photodiode 154 to a storage node, and then each pixel 136 may be read out row by row.

Figure 6A:
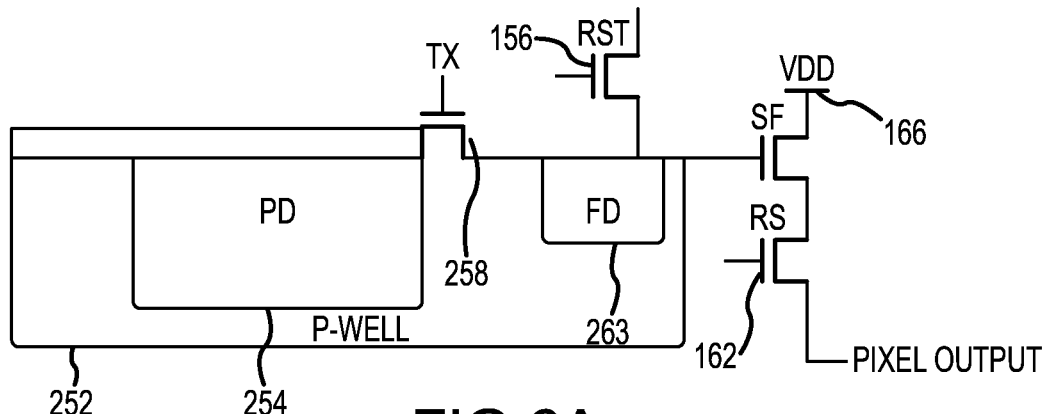
FIG. 6A is a diagram of a conventional pixel circuit including a blooming pathway to the floating diffusion node.
Figure 6B:
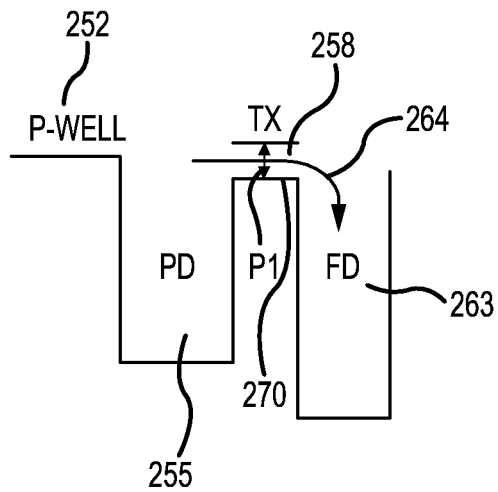
FIG. 6B is a potential diagram of the pixel of FIG. 6A.

In some instances, a scene or object to be captured may include one or more bright light sources or may include a higher percentage of certain light wavelengths than others. In these instances, one or more pixels may exceed their charge limitations and may bloom. FIG. 6A is a diagram of a conventional pixel circuit including a blooming pathway to the floating diffusion node. FIG. 6B is a potential diagram of the pixel of FIG. 6A. With reference to FIGS. 6A and 6B, in conventional image sensors, the photodiode 254, floating diffusion 263, and transfer gate 158 may be surrounded by a P-well 252. A charge path 264 is defined by the transfer gate 258 to the floating diffusion 263. In this manner, the floating diffusion 263 may act to collect overflow charge from the photodiode 254, such as excess charge due to blooming.

In order to allow charge to transfer between the photodiode 254 and the floating diffusion 263 when the transfer gate 258 is not activated (e.g., off), a barrier 270 needs to be lowered. For example, as shown in FIG. 6B, the barrier 270 may have a potential of P1. In operation, once charge from the lens 126 has filled the entire photodiode 254, the charge may flow into the floating diffusion 263 due to the lowered potential P1 of the barrier 270.

In the conventional pixels illustrated in FIGS. 6A and 6B, the potential P1 of the transfer gate 258 may not be sufficiently negative to pin a surface of the transfer gate 258. In other words, to define a path for excess charge, the transfer gate is typically unpinned (i.e., the transfer gate does not include a shallow doped layer at the surface, where the potential of the surface is pinned to the substrate potential). Therefore, in conventional image sensors, the unpinned transfer gate may create dark current, as well as hot pixels. This is because typically the surface doped layer of a pinned gate masks traps that can be one of the main sources of dark current. In other words, the fully pinned transfer gate surface can protect traps (which may be due to foreign objects or particles in the substrate) from receiving electrons that could then be recombined or released to form dark current or hot pixels. Generally, any trap surrounding the transfer gate may be a potential source of dark current and hot pixels and by pinning the transfer gate, the traps may be protected. Additionally, by being unpinned, the transfer gate may increase the chance of hot pixels (i.e., pixels that unnaturally bright).

Blooming Node

Figure 7A:
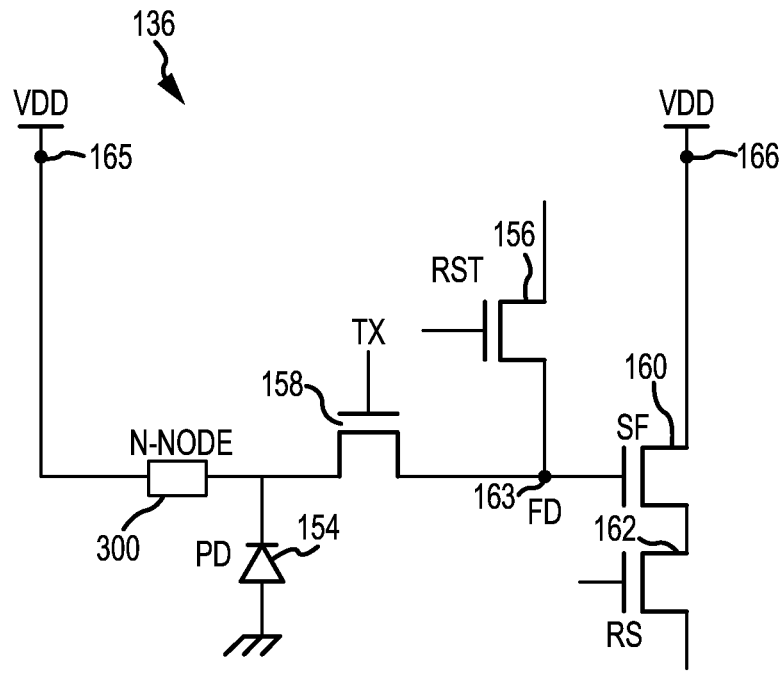
FIG. 7A is a schematic diagram of a pixel of the image sensor including the blooming node.
Figure 7B:
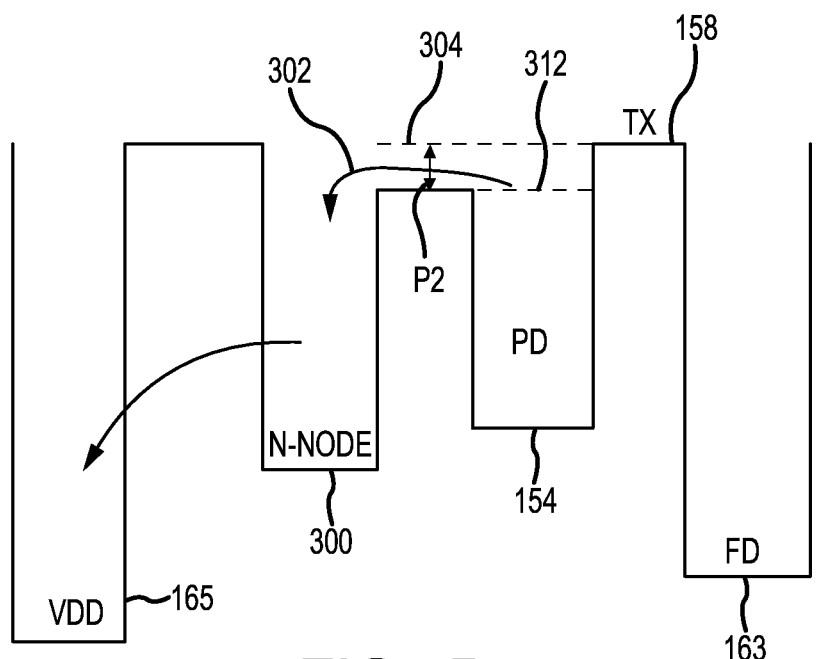
FIG. 7B is a potential diagram of the pixel of FIG. 7A.

The image sensor 130 of the present disclosure may include a blooming node that may receive excess charge from the photodiode, as well as allow the transfer gate to be pinned, reducing dark current and hot pixels. FIG. 7A is a schematic diagram of a pixel of the image sensor including the blooming node. FIG. 7B is a potential diagram of the pixel of FIG. 7A. In some embodiments, the image sensor 130 may include a blooming node 300 in communication with the photodiode 154. The blooming node 300 may be in communication with a blooming voltage source 165. As shown in FIG. 7A, the blooming voltage source may be a separate voltage source 165; however, in other embodiments, the blooming voltage source may be Vdd 166. Accordingly, it should be noted that the blooming node 300 may be connected to its own control voltage signal or another control signal. For example, the blooming node 300 may be connected to the floating diffusion node 163, pixel output, or the like. As another example, the blooming node may be connected to a separate blooming node voltage source that may provide power specifically to the blooming node. As yet another example, the blooming node may be connected to the same voltage source as the other components of the pixel.

The blooming node 300 node may be positioned on an opposite side of the photodiode 154 from its connection to the transfer gate 158. However, in other embodiments the blooming gate may be otherwise connected to the pixel to provide a blooming path for the pixel.

With reference to FIG. 7B, the blooming node 300 may define a blooming path 302 through a bridge region 304. As will be discussed in more detail below, the bridge region 304 may have a potential P2 that may be defined to allow charge to transfer from the photodiode 154 to the blooming node 300. The bridge region 304 reduces the barrier between the photodiode 154 and the blooming node 300, which will allow extra charge from the photodiode 154 to follow the blooming path 302 to the blooming node 300. Because the blooming node 300 is connected to Vdd 165 (or another potential source), the blooming node 300 may continue to receive charge from the photodiode 154 without reaching capacity. The blooming node 300 may only receive charges from the photodiode 154 when the potential in the photodiode 154 is higher than the barrier between the photodiode and the blooming node. Operation of the blooming node 300 will be discussed in more detail below.

The blooming node 300 and the bridge region 304 may be defined by varying the doping profile of a substrate of the image sensor. One or more pixels 152 of the image sensor 130 may be formed in a semiconductor substrate that may be doped with certain elements to create components of the image sensor. For example, the semiconductor substrate may be silicon doped with arsenic, boron, antimony, arsenic, aluminum, selenium, germanium, or the like, depending on the particular semiconductor. In particular, the silicon substrate may be doped with a P-type dopant such as boron or gallium and/or N-type dopant such as phosphorous or arsenic. The type of dopant, as well as the concentration, may be varied depending on the desired characteristics of the image sensor and pixel.

Figure 8:
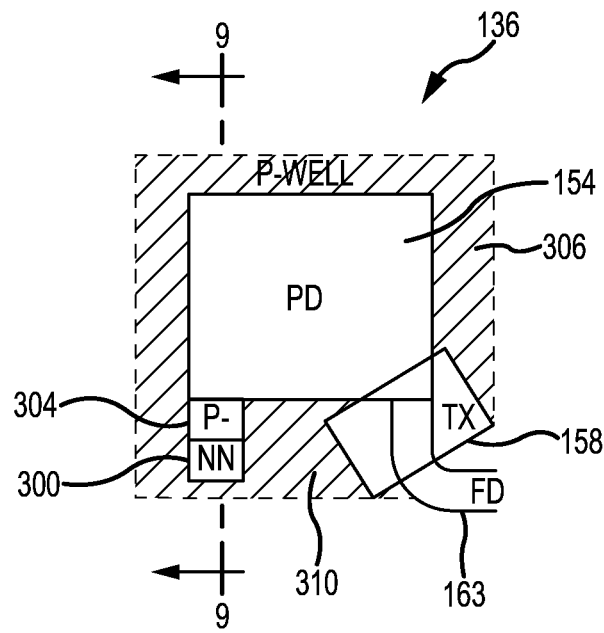
FIG. 8 is a top plan view of the pixel with a top surface layer hidden for clarity.
Figure 9:
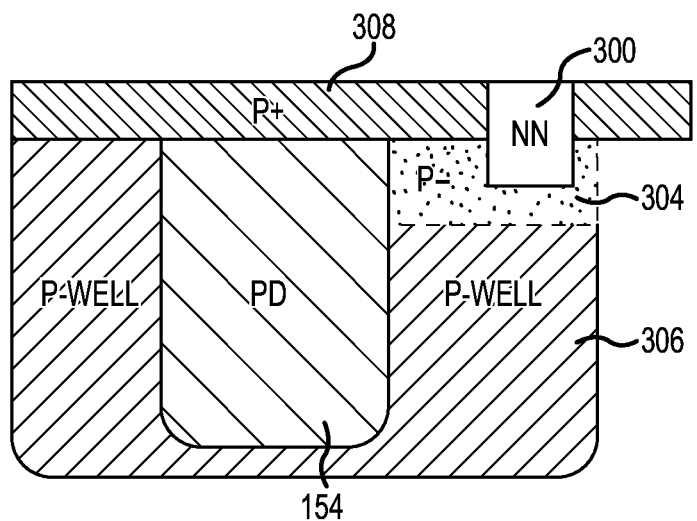
FIG. 9 is a cross-section of the pixel taken along line 9-9 in FIG. 8.

The structure for one or more pixels 136 of the image sensor 130 will now be discussed in more detail. FIG. 8 is a top plan view of the pixel 136 with a top surface layer hidden for clarity. FIG. 9 is a cross-section of the pixel taken along line 9-9 in FIG. 8. With reference to FIGS. 8 and 9, the pixel 136 includes a substrate 310 defining the photodiode 154 substantially surrounded by a well 306. The substrate 310 may be a semiconductor material, such as silicon and the photodiode 154 and other components in the substrate 310 may be defined by varying the concentration of one or more dopants within the substrate 310.

In some embodiments, the photodiode 154 may be N-type doped and the well 306 may be P-type doped or a P-well. The well 306 may surround the photodiode 154 and the transfer gate 158. A path to the floating diffusion node 163 may be defined beneath the transfer gate 158 (e.g., when the transfer gate is activated), allowing charge to travel from the photodiode 154 to the floating diffusion 163.

With reference to FIG. 9, a surface of the pixel 136 or protective layer may be more strongly doped than the well 306. For example, the surface 308 may be P+ doped (e.g., a doping concentration ranging between $10^{18}/cm^3$ to $10^{19}/cm^3$) whereas the well 306 may be P or P− doped (e.g., a doping concentration ranging between $10^{15}/cm^3$ to $10^{17}/cm^3$) and the photodiode 154 may be buried beneath the surface 308. By increasing the dopant level in the surface 306, the photodiode 154 may be pinned. The pinned photodiode 154 reduces surface defect noise such as dark current. As an example, because of the highly doped surface, a negative voltage may be applied to the transfer gate 158 to pin the transfer gate 158 surface, suppressing dark current. As one implementation, a voltage of negative 1.2V may be applied to the transfer gate 158, pinning the transfer gate 158.

With reference again to FIGS. 8 and 9, the bridge region 304 and blooming node 300 may be formed against one portion of the photodiode 154. In some embodiments, the bridge region 304 and the blooming node 300 may be at least partially surrounded by the well 306. The blooming node 300 may be an N-typed doped region or may otherwise have a positive potential. For example, the blooming node 300 may be doped with an N-typed dopant in a concentration ranging between $10^{17}/cm^3$ to $10^{20}/cm^3$.

The blooming node 300 or the N-type node (NN) may be formed through the surface 308 of the pixel 136. In other words, in some embodiments, the blooming node 300 may not be buried beneath a P+ doped area or may include at least one contact or portion exposed through the surface. This is because the blooming node 300 may be biased externally (e.g., by the blooming node voltage source 165) and thus includes a contact exposed on the surface to connect to the biasing source. Additionally, the blooming node 300 may extend from a top of the surface 308 into the bridge region 304. In some embodiments, the blooming node 300 may have a depth greater than the highly doped surface 308. By extending the blooming node 300 into the bridge region 304, extra blooming charge can drain from the photodiode 154 to the blooming node through the bridge region 304. In some embodiments, the blooming node 300 may be on the surface of the substrate 310 to reduce the depth of the doping required to define the node 300.

With reference to FIGS. 7A and 8, the blooming node 300 may be connected to a separate positive bias (blooming voltage source 165) or may be connected to the shared pixel power supply 166. The blooming node 300 may rely on a blooming voltage source or positive bias to deplete charge from the node 300 as it is received. In other words, the blooming node 300 may define an extra junction in the pixel circuitry and may clear out blooming charge without requiring a separate gate (such as an anti-blooming gate). This may reduce the complexity of the pixel circuitry, as well as reduce the required size of the image sensor. By connecting the blooming node 300 to a potential source, excess charge from the photodiode 154 that reaches the blooming node 300 may be pulled out.

In some embodiments, the potential of the blooming node 300 may be substantially any voltage source that has a potential higher than the potential of the photodiode 154. Additionally, as will be discussed in more detail below, the voltage source connected to the blooming node 300 may be a pulsed or variable source or may be substantially continuous.

The bridge region 304 may connect the blooming node 300 to the photodiode 154. The bridge region 304 may be a lightly doped P-type region (LDP). For example, the bridge region 304 may be doped to be P– (e.g., a P-type dopant concentration of $10^{15}/cm^3$ to $10^{17}/cm^3$). In this example, the bridge region 304 has a lower P-type dose than the P-type concentration in the well 306. The lower doping concentration of the bridge region 304 creates a lower potential barrier between the photodiode 154 and the blooming node 300 as compared to other areas of the well 306 region. In other words, a barrier under the bridge region 304 may be lower than the remaining areas of the well 306, forming a pathway for charge to travel from the photodiode 154 to the blooming node 300. In some embodiments, charge may travel through the bridge region 304 to the blooming node 300 and the pathway may be defined through the bridge region. It should be noted (as shown in FIG. 9), that the surface 310 may include the protective doping layer P+ above the bridge region 304. This highly doped surface 308 protects the silicon surface and reduces dark current and hot pixels.

Operation of the blooming node 300 to remove excess charge from the photodiode 154 will now be discussed in more detail. With reference to FIGS. 7A-9, the photodiode 154 may be reset prior to beginning integration. As discussed above with respect to FIG. 5, the photodiode 154 may be reset by activating the transfer gate 158 and the reset gate 156. Once the photodiode 154 has been reset, the photodiode 154 may begin integration and receive light form the lens 126. As the photodiode 154 is exposed to light, it may begin collecting charge carriers. During integration, if the photodiode 154 collects too much charge or otherwise exceeds its well capacity (indicated by dashed line 312), the excess charge may following the blooming path 302 defined by the potential P2 through the bridge region 304 to the blooming node 300. Because the bridge region 304 is lightly doped, the barrier between the photodiode 154 and the blooming node 300 may be lower than the well 306 region, allowing the charge to bloom to the blooming node 300. For example, the bridge region 304 may have a potential that is slightly higher than the potential of the photodiode 154. In a specific implementation, the bridge region 304 may have a potential greater than the photodiode 154 by about 200 mV.

The blooming node 300 junction is tied to a voltage source 165, therefore the excess charge received into the blooming node 300 will be pulled into the potential of the Vdd 165 (see FIG. 7B). As the voltage source Vdd 165 may have a controlled potential level, the potential "well" of the blooming node 300 may remain the same although excess charge is dumped into the node 300. In other words, the blooming node 300 may not have a "well" that may fill to capacity, because the junction of the blooming node 300 is tied to a controlled voltage source that may absorb the excess current without changing the potential at the node. Thus, the blooming node 300 may pull excess charge from the photodiode 154 without reaching a full well capacity. This may prevent the pixel from blooming, even if the photodiode 154 is exposed to a substantial level of excess light.

In embodiments where the voltage source 165 connected to the blooming node 300 may be separate from the voltage source Vdd 166, the blooming node voltage source may be pulsed. For example, the voltage source of the blooming node may be configured to go high once every frame. In these embodiments, excess charge from the photodiode 154 may be pulled every time the voltage source goes high, which may be selected to be pulsed once every frame. However, in other embodiments, the voltage source for the blooming node 300 may be activated before (or at the same time) as integration. In this manner, the blooming node 300 may collect charge initially, rather than during a set time during integration. As another example, the voltage source may be pulsed multiple times during integration.

Once integration is complete, the voltage source 165 of the blooming node 300 may turn off (or go to a low potential) and the transfer gate 158 may be activated. In some embodiments, the voltage source for the transfer gate 158 may turn on separately from the blooming node 300 to encourage charge transfer from the photodiode 154 to the floating diffusion 163 via the transfer gate 158. In other words, by deactivating the voltage source of the blooming node 300 during read out, the potential of the blooming node 300 may be increased, such that charge within the photodiode 154 may travel to the floating diffusion 163 (and not the blooming node). The charge may then be transferred to the floating diffusion 163 for readout. The processor may then use the collected light data to create an image that may be displayed on the display and/or stored in memory.

Shared Blooming Node Configurations

Figure 10A:
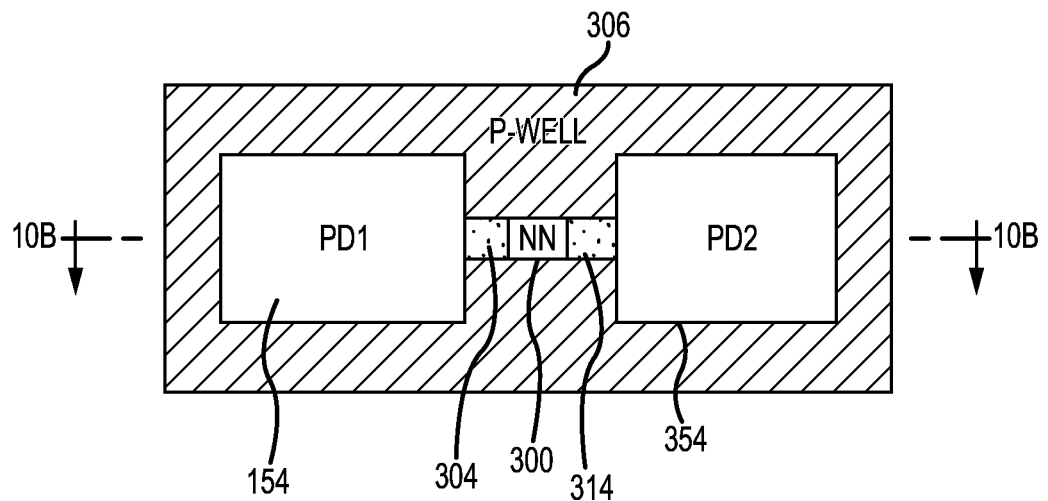
FIG. 10A is a top plan view of two pixels sharing a blooming node with a top surface layer hidden for clarity.
Figure 10B:
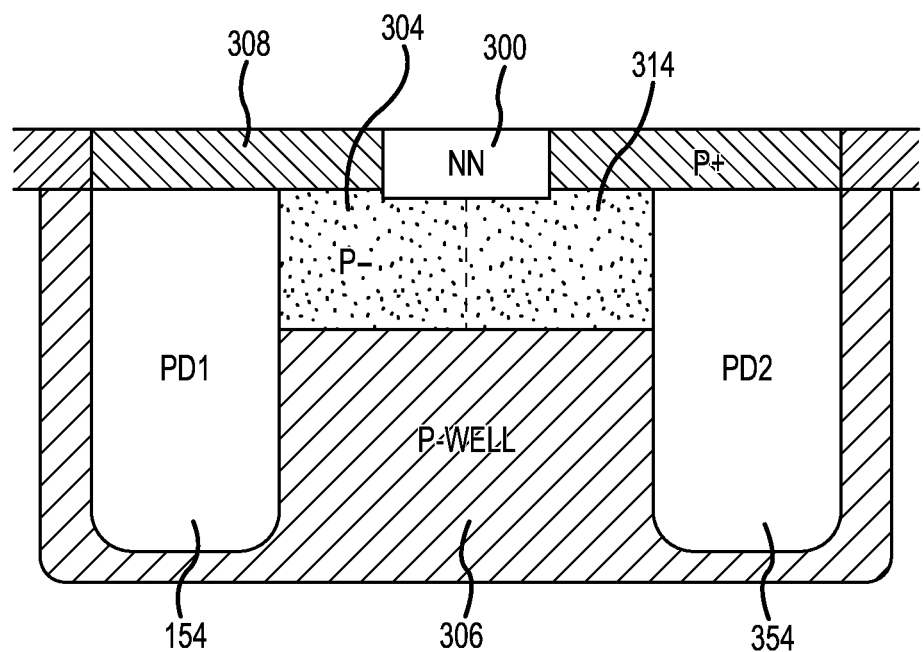
FIG. 10B is a cross-section of the pixels illustrated in FIG. 10A taken along line 10B-10B in FIG. 10A.

In some embodiments, the blooming node 300 may be shared by two or more pixels. FIG. 10A is a top plan view of two pixels sharing a blooming node with a top surface layer hidden for clarity. FIG. 10B is a cross-section of the pixels illustrated in FIG. 10A taken along line 10B-10B in FIG. 10A. With reference to FIGS. 10A and 10B, two photodiodes 154, 354 may be defined in the same substrate 310 and the well 306 may surround (or substantially surround) both photodiodes 154, 354. It should be noted that transfer gate and floating diffusion are hidden for clarity as well in FIGS. 10A and 10B.

The blooming node 300 may be connected to the first photodiode 154 through the bridge region 304 and to the second photodiode 354 by a second bridge region 314. With reference to FIG. 10B, both bridge regions 304, 314 may be formed in the same area of the substrate and may extend beneath the blooming node 300. Additionally, the highly doped surface 308 may extend over both photodiodes 154, 354 to pin both photodiodes.

Figure 11:
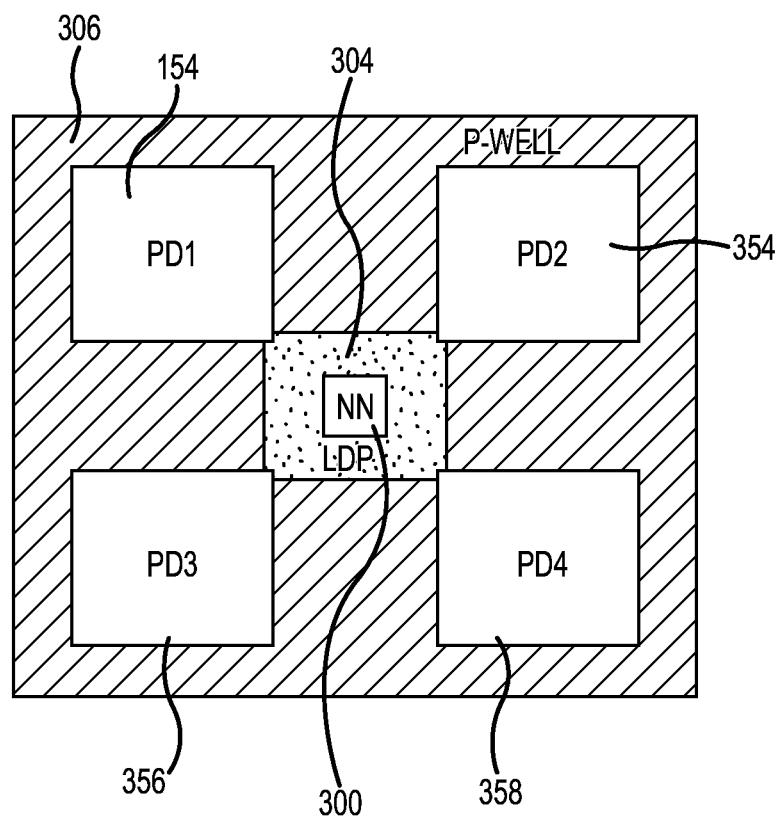
FIG. 11 is a simplified top plan view of four photodiodes having a common blooming node with a top surface layer hidden for clarity.

As another example, the blooming node 300 may be shared by a group or cluster of pixels. FIG. 11 is a simplified top plan view of four photodiodes having a common blooming note 300 with a top surface layer hidden for clarity. With reference to FIG. 11, each of the photodiodes 154, 354, 356, 358 may be in communication with the blooming node 300 through a bridge region 304 extending between each photodiode and the blooming node 300. As with the embodiment illustrated in FIGS. 8 and 9, the bridge region 304 may be a lightly doped region, such that the substrate 310 may have a lower barrier beneath the bridge regions 304, allowing charge to transfer from the photodiodes to the blooming node.

With reference to FIGS. 10A and 11, each of the blooming nodes 300 may receive overflow charge from two or more photodiodes. However, because the blooming nodes 300 may be connected to a voltage source to control their potential, the blooming nodes 300 may receive the overflow charge from each of the photodiodes without overfilling their capacity. That is, the blooming node 300 may receive substantially an infinite amount of bloom charge due to its connection to a voltage source 166.

Embodiments of the present disclosure may relate to an image sensor including a blooming junction or node. The blooming node may be connected to the photodiodes through a bridge or lightly doped region that may have a reduced barrier through the substrate, allowing charge to flow from the photodiodes to the blooming node. The blooming node may be tied to a blooming voltage source, allowing the blooming node to receive excess charge without reaching a full well capacity. The blooming node may be controlled by its own voltage source (e.g., to allow for specific adjustments in voltage based on desired characteristics), or may be tied to one or more voltage sources of the pixels (e.g., pixel power supply, the floating diffusion supply, or the like). Additionally due to the structure of the blooming node, the extra charge from the photodiode may be prevented from "blooming" to adjacent pixels, but without requiring a tradeoff increase in dark current or hot pixels.

CONCLUSION

The foregoing description has broad application. For example, while examples disclosed herein may focus on a blooming node for CMOS image sensors, it should be appreciated that the concepts disclosed herein may equally apply to other types of image sensors, such as CCD image sensors. Similarly, although depth sensing system may be discussed with respect to image sensors, the devices and techniques disclosed herein are equally applicable to other types of sensors or semiconductor devices. Moreover, although row select gates are described with respect to the pixel architecture, the embodiments disclosed herein may be used in image sensor pixel architectures that do not include row select pixels, as well as other variations of pixel architecture. Accordingly, the discussion of any embodiment is meant only to be exemplary and is not intended to suggest that the scope of the disclosure, including the claims, is limited to these examples.

What is claimed is:

1. An image sensor for an electronic device, comprising:
    a first light sensitive element for collecting charge and having a first saturation value;
    a well surrounding at least a portion of the first light sensitive element and having a first doping concentration;
    a bridge region defined in the well and in communication with the first light sensitive element and having a second doping concentration; and
    a blooming node in communication with the bridge region and a voltage source;
        wherein the second doping concentration is less than the first doping concentration; and
        when the first light sensitive element collects sufficient charge to reach the first saturation value, additional charge received by the first light sensitive element travels to the blooming node via the bridge region.

2. The image sensor of claim 1, wherein the well and the bridge region are both doped with the same type of dopant.

3. The image sensor of claim 2, wherein the well and the bridge region are doped with a P-type dopant.

4. The image sensor of claim 3, wherein the blooming node is defined by a N-typed doped region.

5. The image sensor of claim 1, further comprising a highly doped surface extending over the first light sensitive element, the well, and at least a portion of the bridge region.

6. The image sensor of claim 5, wherein the highly doped surface has a third doping concentration, wherein the third doping concentration is greater than both the first doping concentration and the second doping concentration.

7. The image sensor of claim 6, wherein the highly doped surface, the well, and the bridge region are all doped with the same dopant type.

8. The image sensor of claim 1, further comprising a second light sensitive element having a second saturation value, wherein the second light sensitive element is in communication with the bridge region.

9. The image sensor of claim 8, wherein the bridge region extends beneath the blooming node.

10. The image sensor of claim 1, wherein the voltage source is pulsed.

11. A camera, comprising:
    a lens; and
    an image sensor in optical communication with the lens, comprising:
        a first pixel including a first photodiode;
        a second pixel including a second photodiode;
        a blooming junction in communication with the first pixel and the second pixel through a bridge region extending between the blooming junction and the first and second photodiodes, wherein the bridge region defines a blooming path between the first photodiode and the second photodiode to the blooming junction, and wherein the bridge region is doped with a first dopant type and the blooming junction is doped with a second dopant type; and
        a blooming voltage source in communication with the blooming junction,
            wherein the blooming voltage source determines a potential of the blooming junction;
            wherein the lens transmits light to the image sensor, creating charge within the first photodiode and the second photodiode; and
            the blooming junction selectively receives charge from the first photodiode and the second photodiode to substantially prevent the first photodiode and the second photodiode from exceeding a saturation value.

12. The camera of claim 11, wherein the bridge region is lightly doped.

13. The camera of claim 11, wherein the image sensor further comprises: a third pixel having a third photodiode; and a fourth pixel having a fourth photodiode; wherein the blooming junction is in communication with the third photodiode and the fourth photodiode.

14. The camera of claim 11, wherein the first photodiode and the second photodiode are substantially surrounded by a well, wherein the well is doped with the first dopant type.

15. The camera of claim 14, wherein the well is doped with a P-type dopant and the blooming junction is doped with an N-type dopant.

16. The camera of claim 14, wherein the image sensor further comprises a highly doped surface extending over the first photodiode, the second photodiode, the well, and at least a portion of the bridge region.

17. The camera of claim 16, wherein the highly doped surface is doped with the first dopant type.

18. The camera of claim 11, wherein the blooming voltage source is a pulsed source.

19. A computing device comprising:
a processor; and
an image sensor in communication with the processor, the image sensor comprising:
a photodiode having a full well value;
a blooming node in communication with the photodiode;
a lightly doped region positioned between the blooming node and the photodiode; and
a voltage source in communication with the blooming node, wherein the voltage source determines a potential of the blooming node; wherein when the photodiode collects charge exceeding the full well value, excess charge is transmitted to the blooming node through the lightly doped region.

20. The computing device of claim 19, wherein the image sensor further comprises a pinned transfer gate in communication with the photodiode, wherein the transfer gate selectively enables charge from the photodiode to be transmitted to the processor.

21. The computing device of claim 19, wherein the lightly doped region is doped with a first dopant type and the photodiode and the blooming node are doped with a second dopant type.

* * * * *